United States Patent
Itoh et al.

(10) Patent No.: US 6,998,654 B2
(45) Date of Patent: Feb. 14, 2006

(54) SEMICONDUCTOR INTEGRATED CIRCUIT DEVICE

(75) Inventors: Rie Itoh, Osaka (JP); Noriaki Matsuno, Hyogo (JP); Masato Tsunoda, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/520,155

(22) PCT Filed: Jul. 14, 2003

(86) PCT No.: PCT/JP03/08884

§ 371 (c)(1),
(2), (4) Date: Jan. 4, 2005

(87) PCT Pub. No.: WO2004/070832

PCT Pub. Date: Aug. 19, 2004

(65) Prior Publication Data

US 2005/0280038 A1  Dec. 22, 2005

(30) Foreign Application Priority Data

Feb. 4, 2003  (JP)  ............................ 2003-027539

(51) Int. Cl.
   *H01L 27/10* (2006.01)
(52) U.S. Cl. ...................... 257/211; 257/922; 257/207; 257/758
(58) Field of Classification Search ................ 257/922, 257/210, 211, 202, 207, 48, 488, 758
See application file for complete search history.

(56) References Cited

U.S. PATENT DOCUMENTS

| 4,535,388 A | * | 8/1985 | Kraus et al. ................ 361/792 |
| 5,723,908 A | * | 3/1998 | Fuchida et al. ............. 257/758 |
| 6,936,898 B1 | * | 8/2005 | Pelham et al. .............. 257/371 |

FOREIGN PATENT DOCUMENTS

| JP | 02-209735 | 8/1990 |
| JP | 2000-076140 | 3/2000 |
| JP | WO 00/28399 | 5/2000 |
| JP | 2001-244414 | 9/2001 |
| JP | 2002-043516 | 2/2002 |

* cited by examiner

*Primary Examiner*—Sara Crane
(74) *Attorney, Agent, or Firm*—McDermott Will & Emery LLP

(57) ABSTRACT

A semiconductor integrated circuit device (10) is composed of an LSI function unit (11) and a shield wiring layer (22) formed on the unit. The LSI function unit (11) includes a semiconductor substrate (12) and a first insulating film (13), and the semiconductor substrate (12) is formed with a circuit element including, for example, a MOS transistor (14). The shield wiring layer (22) is composed of a lower shield line (23), a third insulating film (24), an upper shield line (25), and a fourth insulating film (26) sequentially stacked above a second insulating film (17). The directions in which the lower and upper shield lines (23) and (25) are arranged intersect each other.

11 Claims, 13 Drawing Sheets

SEMICONDUCTOR INTEGRATED CIRCUIT DEVICE

TECHINICAL FIELD

The present invention relates to semiconductor integrated circuit devices, such as IC cards, of which high levels of security are demanded and which have means for preventing physical alterations.

BACKGROUND ART

In semiconductor integrated circuit devices (LSIs) requiring high levels of security, there is a fear that physical alterations might be made to circuits thereof and thereby provide change in operations of the devices, leakage of confidential information in the devices, or other disadvantages. This fear poses a serious threat to the devices.

The alterations mentioned above are generally made in such a manner that using a focused ion beam (FIB) apparatus, an upper portion of an LSI is radiated with ion beams to cut interconnection lines of the LSI and to deposit metal for use in interconnection, and that a piece of the cut interconnection line is electrically connected to another interconnection line located around the cut interconnection line.

Hereinafter, a conventional semiconductor integrated circuit device provided with shield lines will be described with reference to FIG. 13.

Referring to FIG. 13, a semiconductor substrate 201 is formed with a MOS transistor 202. On the MOS transistor 202, a first insulating film 203 is formed which covers the MOS transistor 202. The first insulating film 203 is formed with a first LSI interconnection line 204 and a second LSI interconnection line 205, and a second insulating film 206 is formed on the first insulating film 203. The semiconductor substrate 201, the MOS transistor 202, the first insulating film 203, the first LSI interconnection line 204, the second LSI interconnection line 205, and the second insulating film 206 are collectively called an LSI function unit 207.

Over the LSI function unit 207, a lower-layer shield line 211, a third insulating film 212, an upper-layer shield line 213, and a fourth insulating film 214 are sequentially formed from bottom up. The lower-layer shield line 211, the third insulating film 212, the upper-layer shield line 213, and the fourth insulating film 214 constitute a shield wiring layer 215 for the LSI.

Since physical alterations to circuits of the device are typically made from the upper side of the LSI, that is, from the opposite side of the LSI to the semiconductor substrate 201, the new shield wiring layer 215 is provided on the LSI function unit 207. With this construction, it is impossible to alter the circuits without removing the upper- and lower-layer shield lines 213 and 211, which makes it more difficult to accomplish alteration.

However, current FIB apparatuses have very high performances, so that it is relatively easy to remove these shield lines 211 and 213 and alter the circuits. As a solution to this problem, for example, PCT International Patent Publication No. WO 00/28399 A1 illustrates a method in which an LSI is provided with a function for detecting alteration to a shield wiring layer, and in the case of detecting alteration, the altered LSI is still kept in a safe condition.

While the LSI is operating, the potentials of the lower- and upper-layer shield lines 211 and 213 are fixed at predetermined voltage levels. During this operation, parasitic capacitances are produced between each of the shield lines 211 and 213 and each of the LSI interconnection lines 204 and 205, which causes delays in signal propagation.

Further, as shown in FIG. 13, the shield lines 211 and 213 are formed in parallel with each other, that is, to extend in the same direction. Therefore, an LSI interconnection line arranged in parallel with the shield lines 211 and 213, such as the second LSI interconnection line 205, has an increased parasitic capacitance, while an LSI interconnection line arranged in perpendicular to the shield lines 211 and 213, such as the first LSI interconnection line 204, has a decreased parasitic capacitance. Thus, the differently arranged (laid) directions of the LSI interconnection lines 204 and 205 create imbalances in signal delay time, which causes a problem that LSI layout design becomes extremely difficult. Moreover, such a construction causes another problem that alteration to interconnection lines using an FIB apparatus is facilitated.

As a still another problem, if physical analysis were conducted on the shield wiring layer 215 itself, the electrical connection relationship in the shield wiring layer 215 would be revealed.

DISCLOSURE OF INVENTION

An object of the present invention is to solve the conventional problems mentioned above and to provide a semiconductor integrated circuit device having an easy-to-design layout and high-security shield lines for preventing circuit alteration.

To accomplish the above object, a first semiconductor integrated circuit device according to the present invention comprises: an integrated circuit; and a shield wiring layer formed above the integrated circuit and preventing a physical alteration to the integrated circuit. The shield wiring layer includes a lower shield line and an upper shield line formed above the lower shield line. The directions in which the lower shield line and the upper shield line are arranged intersect each other.

With the first semiconductor integrated circuit device, in the shield wiring layer including the lower and upper shield lines, the directions in which the lower shield line and the upper shield line are arranged (laid) intersect each other. Therefore, parasitic capacitances produced in interconnection lines (LSI interconnection lines) of the integrated circuit are averaged, whereby the layout design of the device is facilitated.

A second semiconductor integrated circuit device according to the present invention comprises: an integrated circuit; and a shield line formed above the integrated circuit and preventing a physical alteration to the integrated circuit. The directions in which the shield line and an interconnection line of the integrated circuit are arranged diagonally intersect each other.

With the second semiconductor integrated circuit device, the directions in which the shield line and the interconnection line of the integrated circuit are arranged diagonally intersect each other. Therefore, the positional relationship between the shield line and the interconnection line of the integrated circuit becomes complicated. As a result, if the interconnect line is altered, a great number of steps are necessary for analysis of the shield wiring layer. This makes it more difficult to make a physical alteration to the interconnection line.

Preferably, in the first semiconductor integrated circuit device, the lower shield line comprises a plurality of lower shield lines and the upper shield line comprises a plurality of upper shield lines, and the device further comprises a selector circuit which electrically connects at least two of the plurality of lower shield lines and/or the plurality of upper shield lines and which can change the line targeted for this connection.

With this device, even though a physical analysis is conducted on the shield wiring layer, determination of how actual connections are made in the shield wiring layer is impossible. This provides a greatly improved level of security to the device.

Preferably, in the second semiconductor integrated circuit device, the shield line comprises a plurality of shield lines, and the device further comprises a selector circuit which electrically connects at least two of the plurality of shield lines and which can change the line targeted for this connection.

Preferably, in the case where the first or second semiconductor integrated circuit device comprises the selector circuit, the selector circuit comprises a plurality of selector circuits, and the plurality of selector circuits are provided above the integrated circuit to have random intervals. With this device, a physical analysis of the shield lines becomes more difficult.

Preferably, in the first semiconductor integrated circuit device, at least one of the lower shield line and the upper shield line has a connector connected to a power source line, a ground line, or a signal line for controlling the integrated circuit.

With this device, if the shield wiring layer is totally exfoliated, normal operations of the integrated circuit are impossible. This provides a greatly improved level of security to the device.

Preferably, in the above case, the connector comprises a plurality of connectors and the plurality of connectors are provided above at least one of the lower shield line and the upper shield line, and the plurality of connectors are provided above the integrated circuit to have random intervals. With this device, if the shield wiring layer is totally exfoliated and subsequently the exposed connectors are reconnected, the time necessary for analysis of the connectors and the processing time for the reconnection increase. Therefore, a great number of steps are required to alter the interconnection line, which provides an improved level of security to the device.

Preferably, in the above case, at least one of the lower shield line and the upper shield line is formed with a plurality of dummy vias randomly arranged without being electrically connected to the signal line. With this device, if the portions of the interconnection lines required to be reconnected are determined by a layout observation (physical analysis), the determination of those portions is extremely difficult, thereby increasing the analysis time. This provides a greatly improved level of security to the device.

Preferably, in the second semiconductor integrated circuit device, the shield line has a connector connected to a power source line, a ground line, or a signal line for controlling the integrated circuit.

Preferably, in the above case, the connector comprises a plurality of connectors and the plurality of connectors are provided above the shield line, and the plurality of connectors are provided above the integrated circuit to have random intervals.

Preferably, in the above case, the shield line is formed with a plurality of dummy vias randomly arranged without being electrically connected to the signal line.

BRIEF DESCRIPTION OF THE DRAWINGS

FIG. 5(a) is a plan view showing shield lines, and FIG. 5(b) is a partly enlarged plan view showing the shield lines and LSI interconnection lines.

BEST MODE FOR CARRYING OUT THE INVENTION

First Embodiment

A first embodiment of the present invention will be described with reference to the accompanying drawings.

Figure 1:
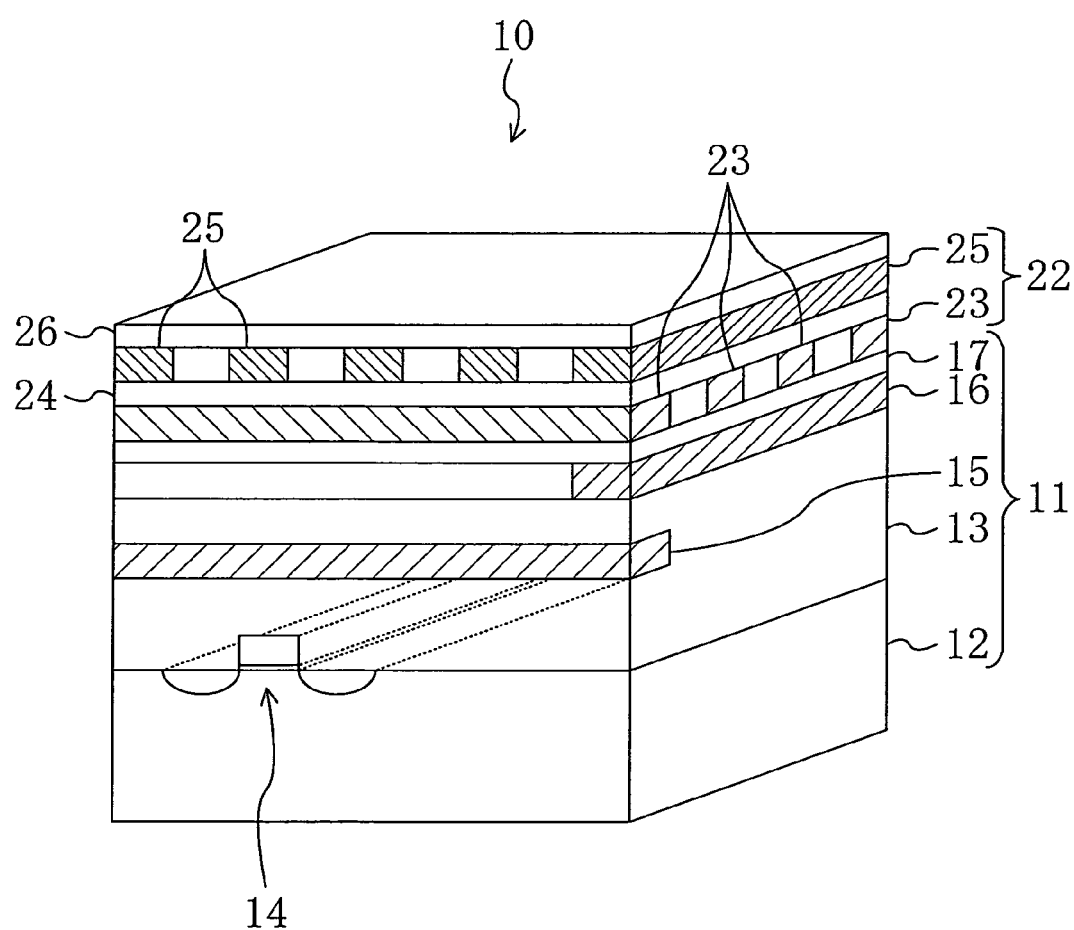
FIG. 1 is a perspective sectional view schematically showing a semiconductor integrated circuit device provided with shield lines according to a first embodiment of the present invention.

FIG. 1 schematically shows the cross-sectional structure of a semiconductor integrated circuit device provided with shield lines according to the first embodiment of the present invention.

Referring to FIG. 1, a semiconductor integrated circuit device 10 according to the first embodiment is composed of an LSI function unit 11 and a shield wiring layer 22 formed on the LSI function unit 11.

The LSI function unit 11 is formed of a semiconductor substrate 12 and a first insulating film 13, and the semiconductor substrate 12 is formed with a plurality of circuit elements including, for example, a MOS transistor 14. The first insulating film 13 is formed with first LSI interconnection lines 15 and second LSI interconnection lines 16. A second insulating film 17 is formed over the first insulating film 13.

The shield wiring layer 22 is composed of lower shield lines 23, a third insulating film 24, upper shield lines 25, and a fourth insulating film 26. They are sequentially formed, from bottom up, above the second insulating film 17.

The first embodiment is characterized in that the directions in which the lower and upper shield lines 23 and 25 are arranged (laid) are perpendicular to each other.

Figure 2A:
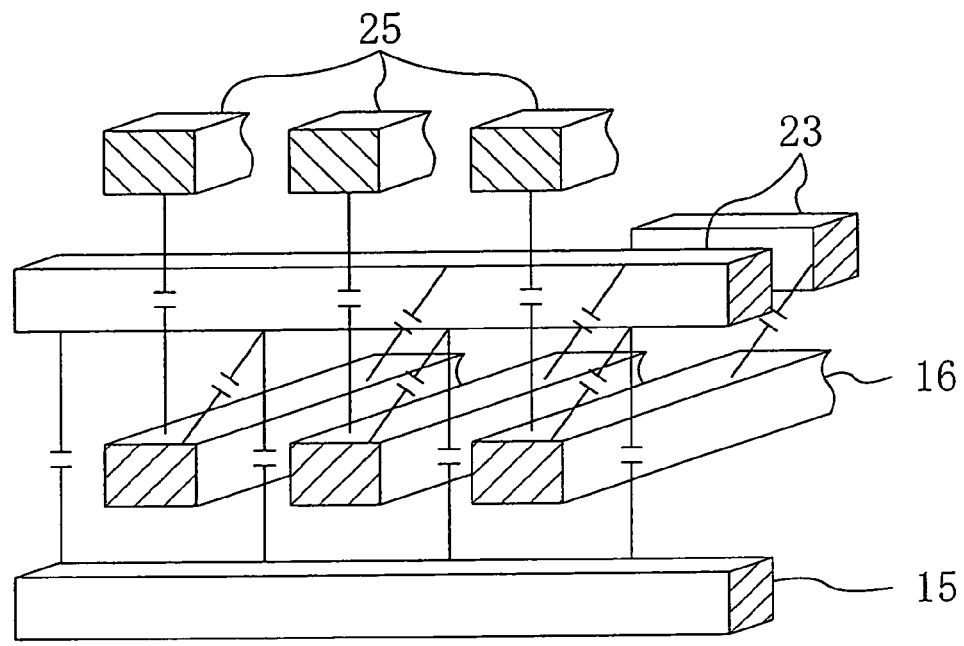
FIG. 2(a) is a schematic view showing parasitic capacitances between a shield wiring layer and LSI interconnection lines of the semiconductor integrated circuit device according to the first embodiment of the present invention.
Figure 2B:
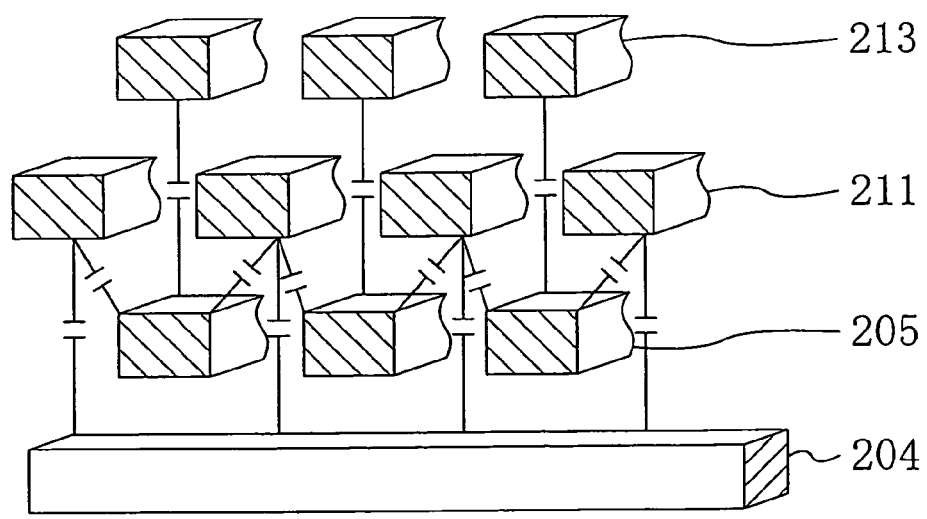
FIG. 2(b) used for comparison is a schematic view showing parasitic capacitances between shield lines and LSI interconnection lines of a conventional semiconductor integrated circuit device.

FIG. 2(a) schematically shows parasitic capacitances between the shield wiring layer and the LSI interconnection lines of the semiconductor integrated circuit device according to the first embodiment. FIG. 2(b) used for comparison schematically shows parasitic capacitances between the shield lines and the LSI interconnection lines of the conventional semiconductor integrated circuit device.

Referring to FIG. 2(a), the second LSI interconnection lines 16 are arranged in perpendicular to the lower shield lines 23 formed above the second LSI interconnection lines 16, and in parallel with the upper shield lines 25 formed above the lower shield lines 23. Thus, since the lower shield lines 23 of the shield wiring layer are arranged in perpendicular to the second LSI interconnection lines 16, the areas of the facing surface portions of the second LSI interconnection lines 16 to the lower shield lines 23 are greatly decreased. Therefore, the parasitic capacitances of the second LSI interconnection lines 16 resulting from the lower shield lines 23 are greatly reduced.

On the other hands, in the case of the conventional example shown in FIG. 2(b), the second LSI interconnection lines 205 are arranged in parallel with any of the lower-layer shield lines 211 and the upper-layer shield lines 213, so that all the shield lines 211 and 213 have surfaces facing the entire wiring lengths of the second LSI interconnection lines 205 and therefore producing parasitic capacitances. As a result, the parasitic capacitances of the second LSI interconnection lines 205 are increased. In contrast to this, the parasitic capacitance of the first LSI interconnection line layer 204 away from the shield wiring layer are significantly decreased. Accordingly, as described above, the parasitic capacitances vary widely depending on the LSI interconnection lines.

Figure 3:
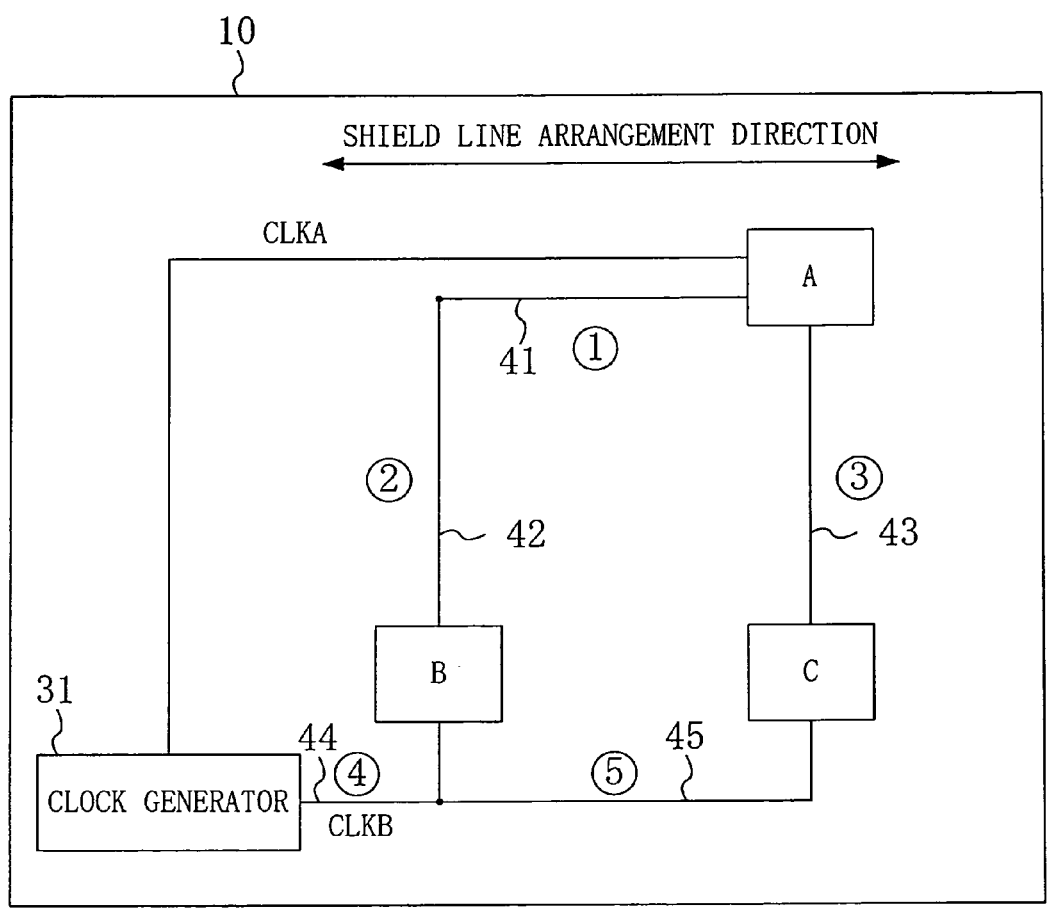
FIG. 3 is a block diagram showing an exemplary circuit configuration of the semiconductor integrated circuit device according to the first embodiment of the present invention, which explains signal delay.

Next description will be made of signal delay in the case where, as an example, the semiconductor integrated circuit device 10 according to the first embodiment has multiple circuits A, B, and C and one clock generator 31 as shown in FIG. 3.

In the semiconductor integrated circuit device 10 shown in FIG. 3, the clock generator 31 for supplying synchronizing signals to the circuit A, the circuit B, and the circuit C is arranged so that the distances at which signals propagate from the generator 31 to the circuits A, B, and C increase in the order of the circuit B, the circuit C, and the circuit A. In this arrangement, a first interconnection line 41 with a wiring length of L1 and a second interconnection line 42 with a wiring length of L2 connect the circuit A to the circuit B, and a third interconnection line 43 with a wiring length of L3 connects the circuit A to the circuit C. Also in this arrangement, a fourth interconnection line 44 with a wiring length of L4 connects the clock generator 31 to the circuit B, and the fourth interconnection line 44 and a fifth interconnection line 45 with a wiring length of L5 connect the clock generator 31 to the circuit C.

Also in this case, if, like the conventional example, the upper and lower shield lines are arranged in parallel with each other, that is to say, the upper and lower shield lines are both arranged in the left-right direction as viewed in FIG. 3, the first interconnection line 41, the fourth interconnection line 44 and the fifth interconnection line 45 are both located to extend in parallel with the shield lines. This produces greatened parasitic capacitances, which in turn increases signal delay.

In this condition, considering that the circuit A sends a signal in synchronism with a first clock signal CLKA output by the clock generator 31 and the circuits B and C receive the signal from the circuit A in synchronism with a second clock signal CLKB, the signal sent by the circuit A reaches the circuit C faster than the circuit B because the wiring length L3 from the circuit A to the circuit C is smaller than the total wiring length L1+L2 from the circuit A to the circuit B. Moreover, by the parasitic capacitances resulting from the shield lines, the amount of delay of the signal propagating through the first interconnection line 41 is about twice as large as those of the other shield lines. Therefore, in comparison with the case where no shield lines are provided in the device, the difference in the propagation speed between the sent signal propagating from the circuit A to the circuit B and the sent signal propagating from the circuit A to the circuit C is further widened.

On the other hands, in consideration of the circuits B and C for receivers, the wiring length L4 from the clock generator 31 to the circuit B is smaller than the total wiring length L4+L5 from the clock generator 31 to the circuit C. Therefore, the second clock signal CLKB reaches the circuit B faster than the circuit C. Moreover, by the parasitic capacitances resulting from the shield lines, the amounts of delays of the signals propagating through the fourth interconnection line 44 and through the fifth interconnection line 45 are very large. Therefore, in comparison with the case where no shield lines are provided in the device, the difference in the propagation speed between the second clock signal CLKB from the clock generator 31 to the circuit B and the second clock signal CLKB from the clock generator 31 to the circuit C is further widened.

Figure 4:
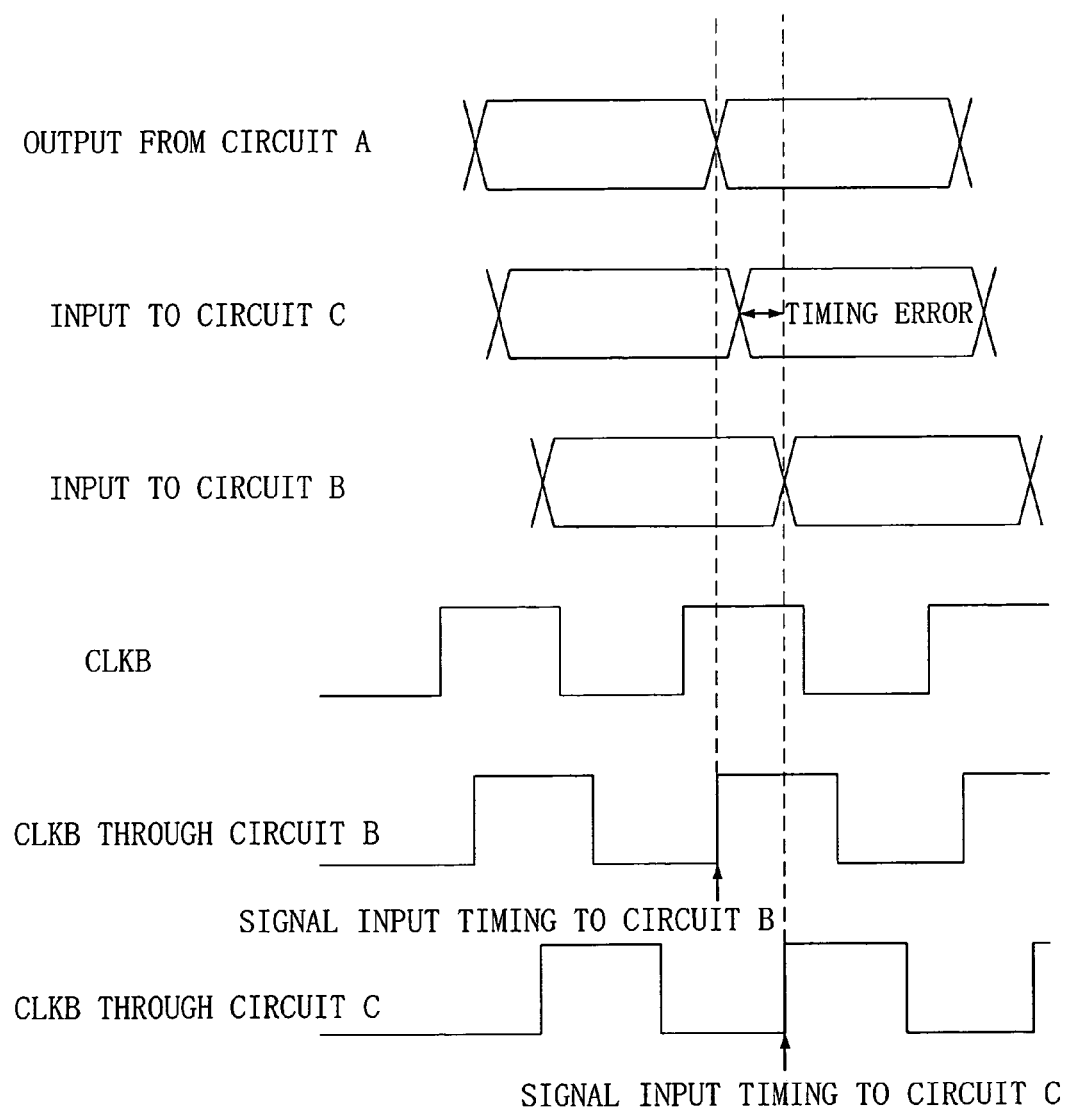
FIG. 4 is a timing chart of signals in the semiconductor integrated circuit device shown in FIG. 3.

FIG. 4 shows the operation timings of the signal output from the circuit A and the second clock signal CLKB, which are obtained in the above-mentioned case. As shown in FIG. 4, when the circuit C receives the signal output from the circuit A at the timing of the rising edge of the second clock signal CLKB, an extremely large timing error occurs.

To prevent this timing error, two approaches have conventionally been proposed when the circuits B and C receive the signal sent from the circuit A in synchronism with the second clock signal CLKB. One approach is that the position at which the clock generator 31 is arranged is modified to allow the second clock signal CLKB to be input to the circuits B and C at an appropriate timing. The other approach is that, in order to compensate the difference in propagation speed through the interconnection line, a delay element is inserted to the system through which the signal sent from the circuit A propagates and the system through which the second clock signal CLKB propagates.

However, it is extremely difficult to find an appropriate position at which the clock generator 31 is arranged. Also, if the delay element is used to adjust the timing, the chip size of the semiconductor integrated circuit device is increased because the inherently unnecessary element is added thereto. In particular, if all the shield lines are arranged to extend in the same direction, the difference in propagation speed is widened. To avoid this problem, the number of delay elements has to be increased.

On the other hands, in the first embodiment of the present invention, the upper and lower shield lines are arranged in perpendicular to each other. Therefore, delays in the first, fourth, and fifth interconnection lines 41, 44, and 45 are reduced, while delays in the second and third interconnection lines 42 and 43 are increased. This narrows the difference in signal propagation speed, which facilitates determination of the position at which the clock generator 31 is arranged.

Moreover, only a few number of delay elements for adjusting the difference in signal propagation speed are required, so that the chip size of the device can be shrunk.

As described above, in the first embodiment, the lower and upper shield lines 23 and 25 constituting the shield wiring layer 22 are arranged in perpendicular to each other. This greatly reduces the parasitic capacitance between each of the shield lines 23 and 25 and each of the LSI interconnection lines 15 and 16, so that the wiring layout of the LSI interconnection lines 15 and 16 is facilitated. As a result, the chip size of the device can be shrunk.

Second Embodiment

A second embodiment of the present invention will be described below with reference to the accompanying drawings.

Figure 5A:
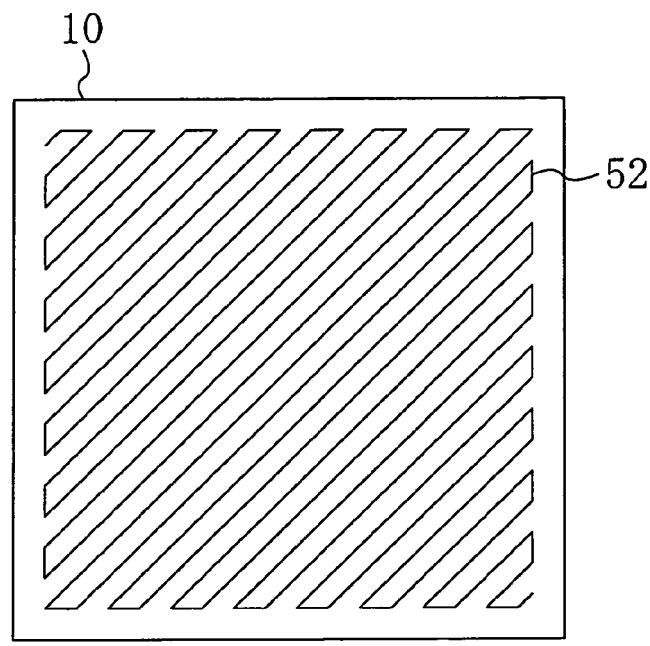
FIGS. 5(a) and 5(b) show a semiconductor integrated circuit device according to a second embodiment of the present invention.
Figure 5B:
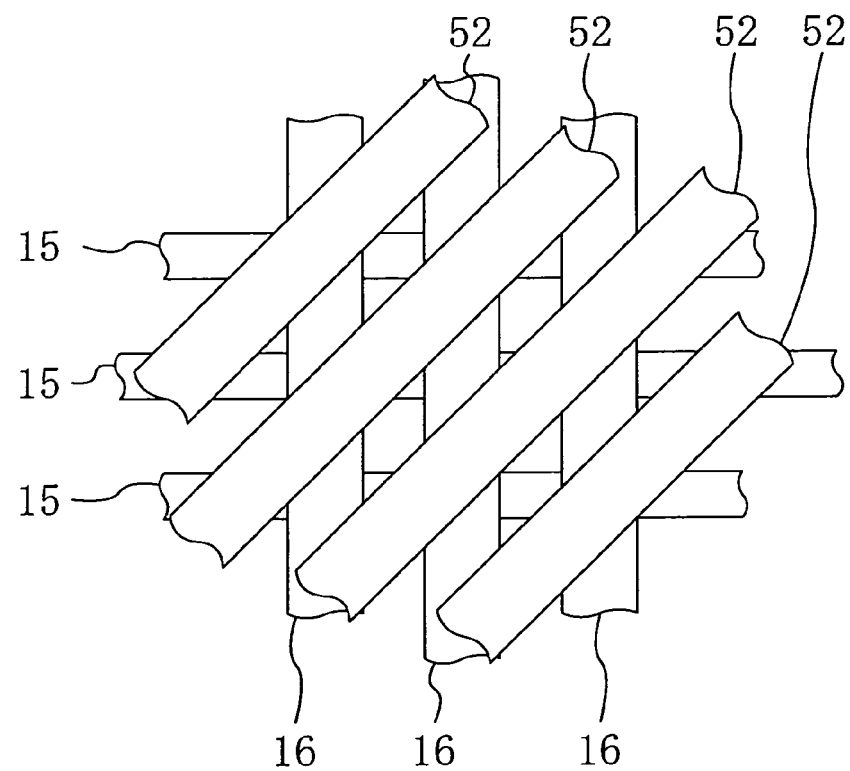

FIGS. 5(a) and 5(b) show a semiconductor integrated circuit device according to the second embodiment of the present invention. FIG. 5(a) is a view showing the plan configuration of shield lines, and FIG. 5(b) is a partly enlarged view showing the plan arrangement of shield lines and LSI interconnection lines. Description of the components shown in FIGS. 5(a) and 5(b) that are the same as those shown in FIG. 1 will be omitted by retaining the same reference numerals.

Referring to FIG. 5(a), shield lines 52 in the second embodiment are spaced in a folded arrangement to extend in parallel with one diagonal line of the semiconductor integrated circuit device (chip) 10 in square plan shape. In this embodiment, each of the shield lines 52 may be composed of a single layer or double layers. If each of the shield lines 52 is composed of double layers, such as upper and lower shield lines, the directions in which the lines contained in one layer are arranged may be in parallel with or in perpendicular to the lines contained in the other layer.

If, as shown in FIG. 5(a), the shield lines 52 are spaced over the entire surface of the chip 10 and particularly in parallel with the diagonal line of the chip 10 and as shown in FIG. 5(b), the first and second LSI interconnection lines 15 and 16 are arranged so that one of the lines 15 and 16 is parallel with one side of the chip 10 and the other thereof is perpendicular to the one side of the chip 10, the parasitic capacitances per unit length produced in the LSI interconnection lines 15 and 16 are equal. Therefore, delays occurring in the first and second LSI interconnection lines 15 and 16 are also equal to each other, whereby timing design of the integrated circuit is greatly facilitated.

Next, an example of an attempt to make a tampered processing (alteration) to the LSI interconnection lines will be described with reference to the accompanying drawings.

Figure 6:
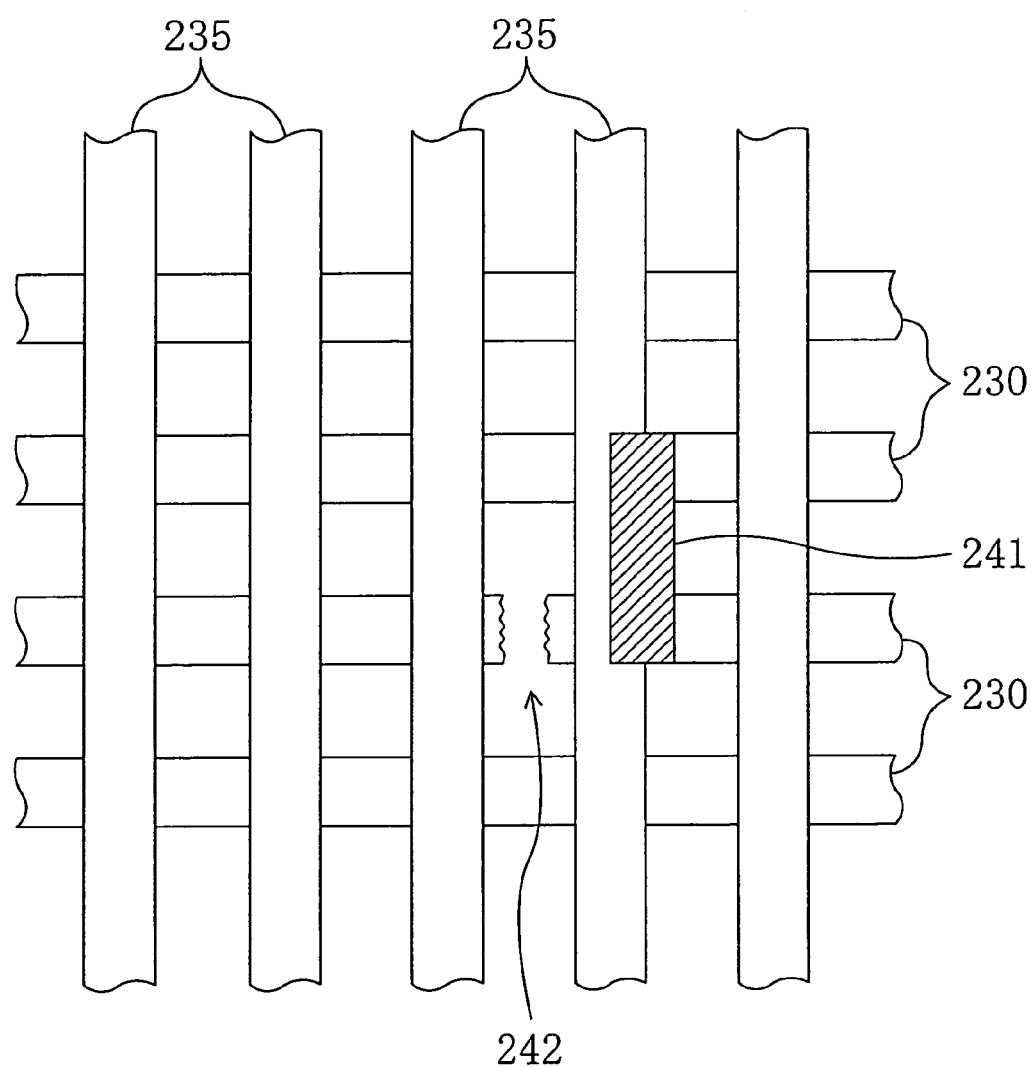
FIG. 6 is a plane view schematically showing an exemplary alteration attempted for the conventional semiconductor integrated circuit device.

FIG. 6 shows the case where, like the conventional example, shield lines 235 are arranged in perpendicular to LSI interconnection lines 230. In this case, we now consider that an attempt is made to electrically connect, using an FIB apparatus, adjacent LSI interconnection lines 230 to each other at a point 241 to be connected by a tampered processing (a tampered-processing connection point 241) and subsequently to cut one of the connected LSI interconnection lines 230 at a point 242 to be cut by a tampered processing (a tampered-processing cut point 242) around the tampered-processing connection point 241 of the connected LSI interconnection lines 230. In this attempt, in order to prevent the shield lines 235 from detecting the tampered processing, a portion of the shield line 235 located above the tampered-processing connection point 241 is removed in advance. After connection is made to produce the tampered-processing connection point 241 and the tampered-processing cut point 242 is cut, the disconnected parts of the shield line 235 located above the tampered-processing connection point 241 are reconnected.

Thus, as shown in FIG. 6, for the conventional construction, only one of the shield lines 235 need to be removed in advance.

Figure 7:
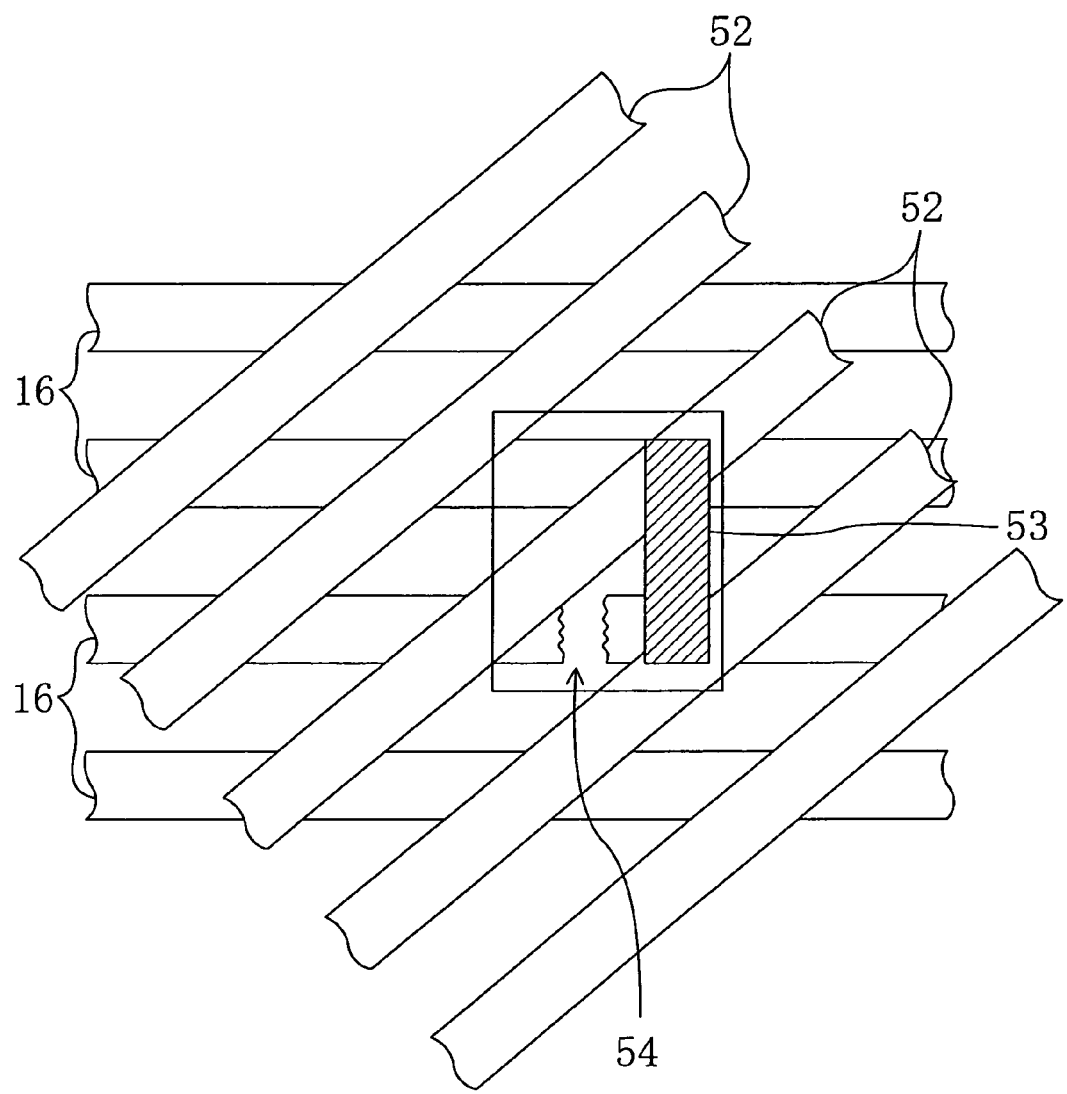
FIG. 7 is a plane view schematically showing an exemplary alteration attempted for the semiconductor integrated circuit device according to the second embodiment of the present invention.

On the other hands, as shown in FIG. 7, for the device having shield lines 52 in the second embodiment, an attempt is made to make a tampered connection (for producing a tampered-processing connection point 53) and a tampered cutting (for producing a tampered-processing cut point 54) to the LSI interconnection lines 16. To accomplish this attempt, portions of three lines of the shield lines 52 has to be removed and then the disconnection parts of the respective three lines has to be reconnected by a reconnection process. However, in a recent integrated circuit outstandingly miniaturized, it is extremely difficult, even at the present time when FIB apparatuses have enhanced performances, to conduct multiple processings on such a fine region in the circuit.

Therefore, by arranging the shield lines 52 diagonally with the arrangement direction of the LSI interconnection lines 16, the number of portions required to be processed increases in a fine region. This increases the time and the number of steps necessary for a tampered processing, and requires sophisticated skill. Consequently, this arrangement provides a greatly improved level of security to the device.

As described above, in the semiconductor integrated circuit device according to the second embodiment, the shield lines 52 provided above the first and second LSI interconnection lines 15 and 16 are arranged diagonally with the arrangement direction of the first and second LSI interconnection lines 15 and 16. By this arrangement, the parasitic capacitances per unit length produced in the first and second LSI interconnection lines 15 and 16 are equal. Therefore, delays occurring in the first and second LSI interconnection lines 15 and 16 are also equal to each other, whereby timing design of the integrated circuit is greatly facilitated.

Moreover, by arranging the shield lines 52 diagonally with the arrangement direction of the LSI interconnection lines 15 and 16, an increased time, an increased number of steps, and sophisticated skill are required for a tampered processing. Consequently, this arrangement provides a greatly improved level of security to the device.

Third Embodiment

A third embodiment of the present invention will be described below with reference to the accompanying drawings.

Figure 8:
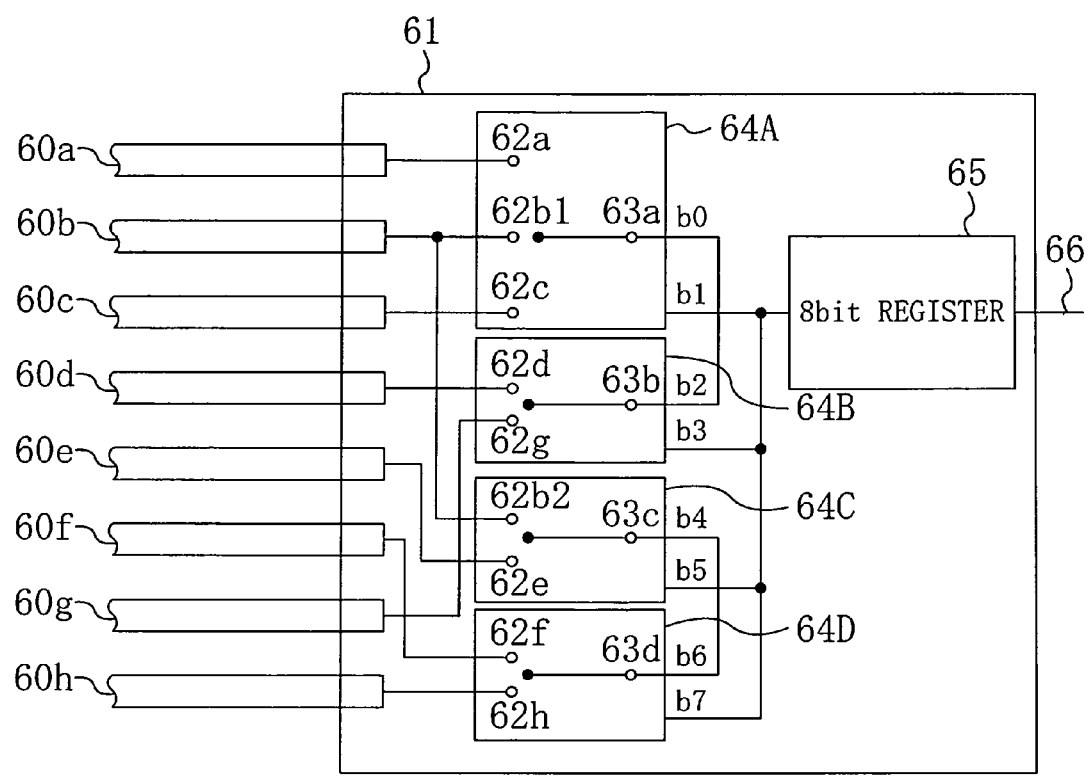
FIG. 8 is a diagram schematically showing an exemplary configuration of a selector circuit for shield lines included in a semiconductor integrated circuit device according to a third embodiment of the present invention.

FIG. 8 schematically shows an exemplary configuration of a selector circuit for shield lines of a semiconductor integrated circuit device according to the third embodiment of the present invention.

Referring to FIG. 8, for example, one end or both ends of each of eight shield lines 60a, 60b, . . . , and 60h are connected to a selector circuit 61 for switching electrical connections between the shield lines 60a to 60h.

The selector circuit 61 has an 8-bit register 65 connected to a programming signal line 66 programmable from the outside. A first switching circuit 64A, a second switching circuit 64B, a third switching circuit 64C, and a fourth switching circuit 64D are provided between the register 65 and the shield lines 60a to 60h.

Although not shown, the register 65 has an 8-bit configuration consisting of bit 0 (b0), bit 1 (b1), . . . , and bit 7 (b7).

The bits 0 and 1 determine the condition of connection between a terminal 63a of the first switching circuit 64A closer to the register 65 and terminals 62a, 62b1, and 62c thereof closer to the shield lines. The bits 2 and 3 determine the condition of connection between a terminal 63b of the second switching circuit 64B closer to the register 65 and terminals 62d and 62g thereof closer to the shield lines. The bits 4 and 5 determine the condition of connection between a terminal 63c of the third switching circuit 64C closer to the register 65 and terminals 62b2 and 62e thereof closer to the shield lines. The bits 6 and 7 determine the condition of connection between a terminal 63d of the fourth switching circuit 64D closer to the register 65 and terminals 62f and 62h thereof closer to the shield lines.

According to the values of the bits 0 and 1 obtained from the register 65, the first switching circuit 64A connects any one of the terminals 62a, 62b1, and 62c closer to the shield lines to the terminal 63a closer to the register 65. According to the values of the bits 2 and 3 obtained from the register 65, the second switching circuit 64B connects the terminal 62d or 62g closer to the shield lines to the terminal 63b closer to the register 65. Thereby, any one of the shield lines 60a, 60b, and 60c is connected to the shield line 60d or 60g.

Likewise, according to the values of the bits 4 and 5 obtained from the register 65, the third switching circuit 64C connects the terminal 62b2 or 62e closer to the shield lines to the terminal 63c closer to the register 65. According to the values of the bits 6 and 7 obtained from the register 65, the fourth switching circuit 64D connects the terminal 62f or 62h closer to the shield lines to the terminal 63d closer to the register 65. Thereby, either of the shield lines 60b and 60e is connected to the shield line 60f or 60h.

As described above, the semiconductor integrated circuit device according to the third embodiment has the selector circuit 61 capable of dynamically changing the connection of one end or both ends of each of the multiple shield lines 60a to 60h. Therefore, even though physical analysis is conducted on the shield lines 60a to 60h, it is extremely difficult to physically analyze how the shield lines 60a to 60h are actually connected. This provides a greatly improved level of security to the device.

Moreover, if the selector circuits 61 are arranged at the both ends of the set of the shield lines 60a to 60h, respectively, the connection relationship between the shield lines becomes more complicated. This provides a more greatly improved level of security to the device.

(Modification of Third Embodiment)

A modification of the third embodiment of the present invention will be described below with reference to FIG. 9.

Figure 9:
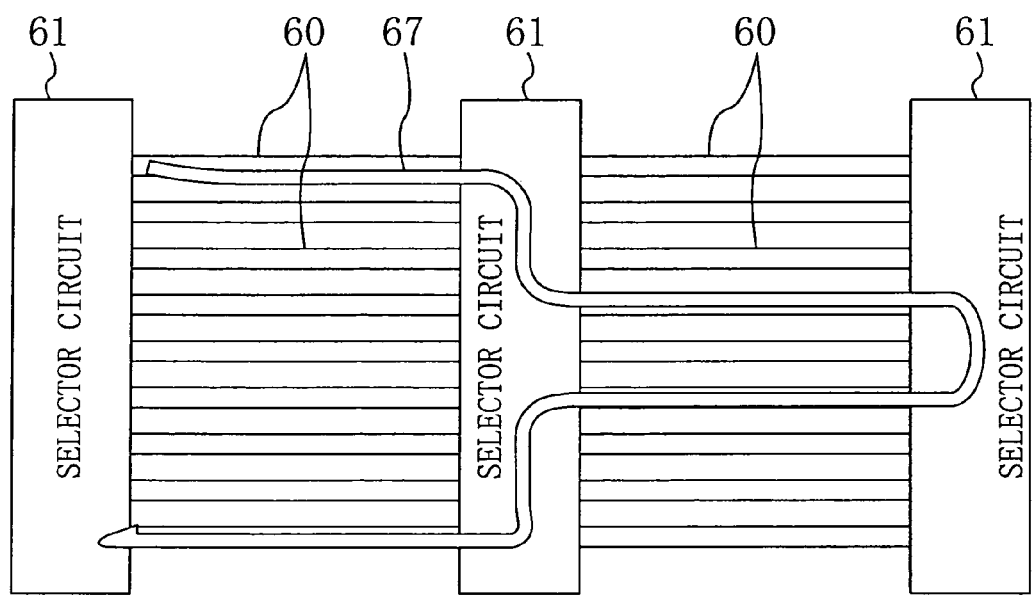
FIG. 9 is a diagram schematically showing an exemplary configuration of selector circuits for shield lines included in a semiconductor integrated circuit device according to one modification of the third embodiment of the present invention.

Referring to FIG. 9, a plurality of selector circuits 61 are arranged not only at the ends of the shield lines 60 but also at positions on the integrated circuit (not shown) so that the selector circuits 61 are spaced at random intervals.

Each of the selector circuits 61 switches target terminals to be connected to the respective shield lines in a similar manner to the third embodiment. The schematic line denoted by the reference numeral 67 is a line composed of electrically connected shield lines of the multiple shield lines 60.

With this configuration, the connections between the shield lines 60 can be changed more complicatedly. This provides a more greatly improved level of security to the device.

Note that in the third embodiment and its modification, the shield lines 60 preferably have the configuration shown in the first or second embodiment.

Fourth Embodiment

A fourth embodiment of the present invention will be described below with reference to the accompanying drawings.

Figure 10:
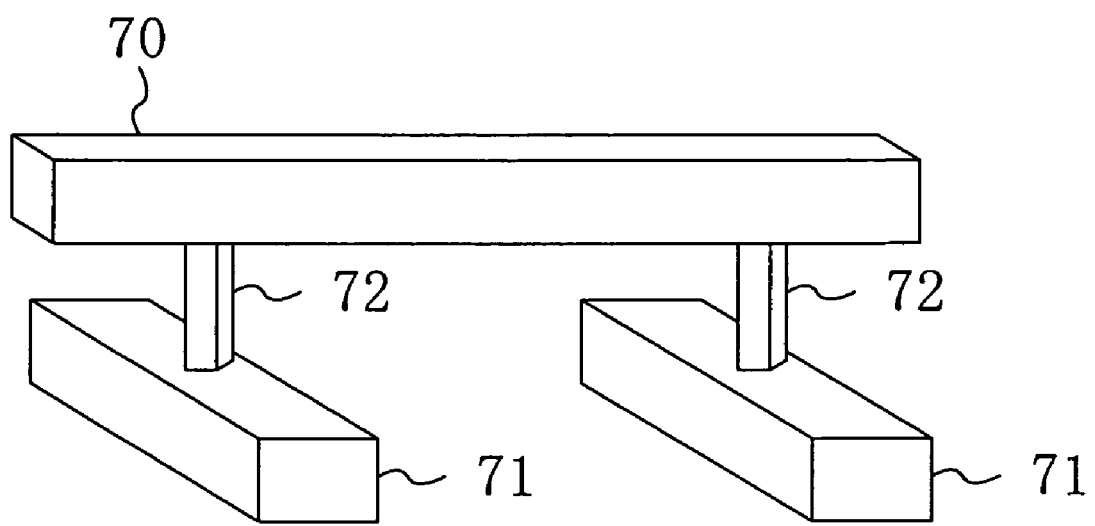
FIG. 10 is a perspective sectional view partly showing a shield line and LSI interconnection lines of a semiconductor integrated circuit device according to a fourth embodiment of the present invention.

FIG. 10 shows the construction relationship between a shield line and LSI interconnection lines of a semiconductor integrated circuit device according to the fourth embodiment of the present invention.

Referring to FIG. 10, a shield line 70 in the fourth embodiment is electrically connected through vias 72 as connectors to a power source line, a ground line (GND), or signal lines 71 for controlling operation of an integrated circuit.

As mentioned above, in attempting to make a physical alteration to a highly miniaturized integrated circuit, removal of multiple shield lines 70 one by one using an FIB apparatus or the like requires a long processing time, a considerable number of processing steps, and sophisticated skill.

On the other hands, total exfoliation of the shield lines 70 using an agent is relatively easy. Then, if an attempt to totally exfoliate the shield lines 70 using an agent is made, however, the integrated circuit itself cannot operate normally because the shield lines 70 are connected to the power source line, the ground line, or the signal lines 71 for controlling operation of the integrated circuit.

As described above, in the semiconductor integrated circuit device according to the fourth embodiment, the shield lines 70 are electrically connected through the vias 72 to the power source line, the ground line, or the signal lines 71 for controlling operation of the integrated circuit. Therefore, in the case where the shield lines 70 are totally exfoliated from the entire surface of the chip, normal operations of the semiconductor integrated circuit device is impossible, which provides a greatly improved level of security to the device.

Note that in the fourth embodiment, the shield lines 70 preferably have the configuration shown in the first or second embodiment.

(First Modification of Fourth Embodiment)

A first modification of the fourth embodiment of the present invention will be described below with reference to the accompanying drawings.

Figure 11:
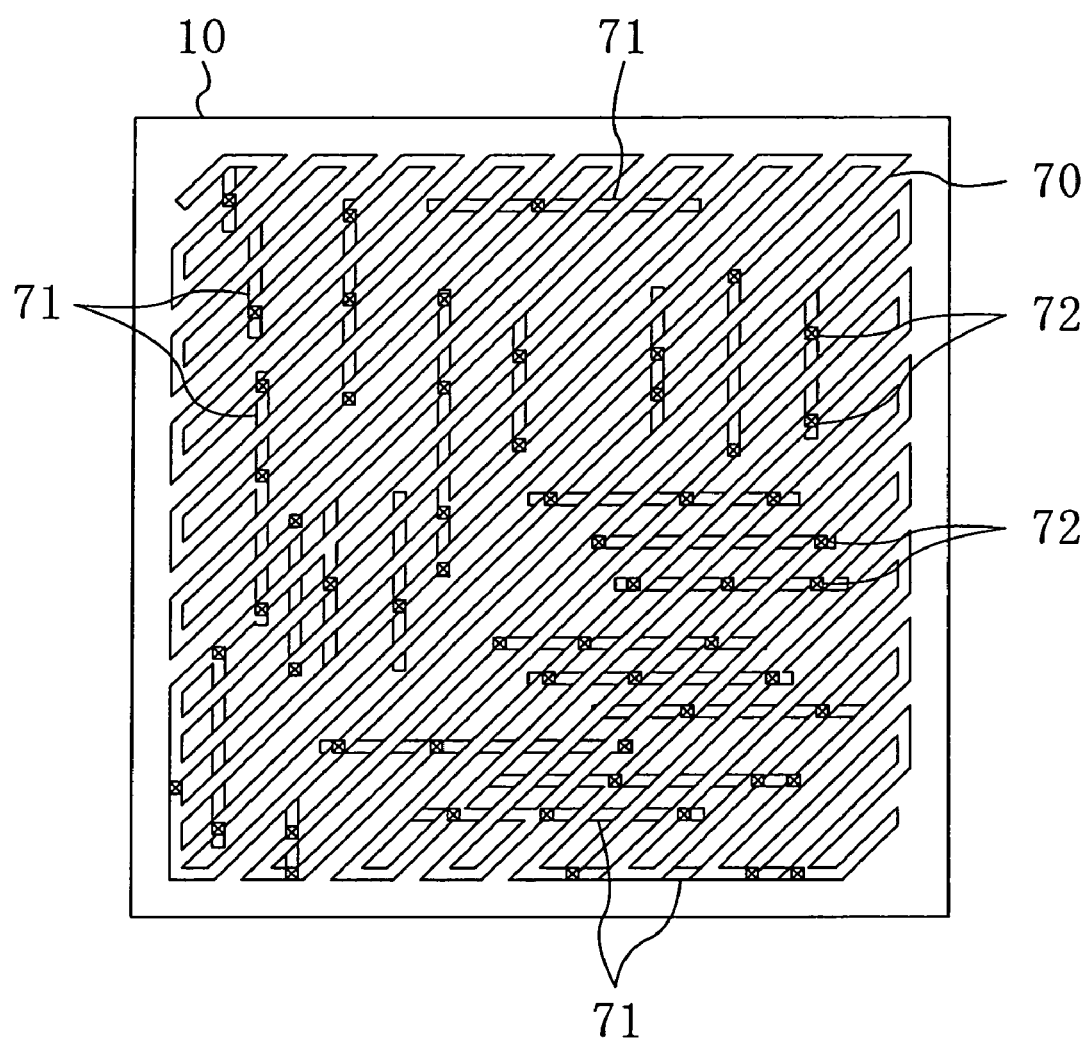
FIG. 11 is a plan view showing shield lines and LSI interconnection lines of a semiconductor integrated circuit device according to a first modification of the fourth embodiment of the present invention.

FIG. 11 shows the plan configuration of shield lines and LSI interconnection lines included in a semiconductor integrated circuit device according to the first modification of the fourth embodiment of the present invention.

Referring to FIG. 11, similarly to the second embodiment, shield lines 70 are spaced in a folded arrangement on a chip 10 to extend in parallel with one diagonal line of the chip 10.

Moreover, under the shield lines 70, a power source line, a ground line, or multiple signal lines 71 which control operation of an integrated circuit are formed which are arranged in parallel with or in perpendicular to one side of the chip 10.

The first modification is characterized in that multiple vias 72 for electrically connecting the shield lines 70 to the multiple signal lines 71 are provided at random intervals.

As mentioned above, if the shield lines 70 are totally exfoliated using an agent, the shield lines 70 and the signal lines 71 electrically connected to each other by the vias 72 are disconnected. Thus, the integrated circuit itself cannot operate normally.

Therefore, for normal operations of the integrated circuit, as substitutes for the removed shield lines 70, the vias 72 used for these connections have to be reconnected by an FIB apparatus or the like. However, since the multiple vias 72 required to be reconnected are present on the chip 10 and arranged randomly, the time taken to analyze the portions required to be reconnected and the processing time by the FIB apparatus increase.

As described above, in the first modification, the multiple vias 72 for electrically connecting the shield lines 70 to the power source line, the ground line, or the signal lines 71 for controlling operation of the integrated circuit are randomly arranged on the chip 10. Therefore, when the vias 72 required to be connected are reconnected after total exfoliation of the shield lines 70, the analysis time and the processing time necessary for these reconnections significantly increase. This certainly provides an improved security to the device.

Note that in the first modification, the shield lines 70 preferably have the configuration shown in the first embodiment.

(Second Modification of Fourth Embodiment)

A second modification of the fourth embodiment of the present invention will be described below with reference to the accompanying drawings.

Figure 12:
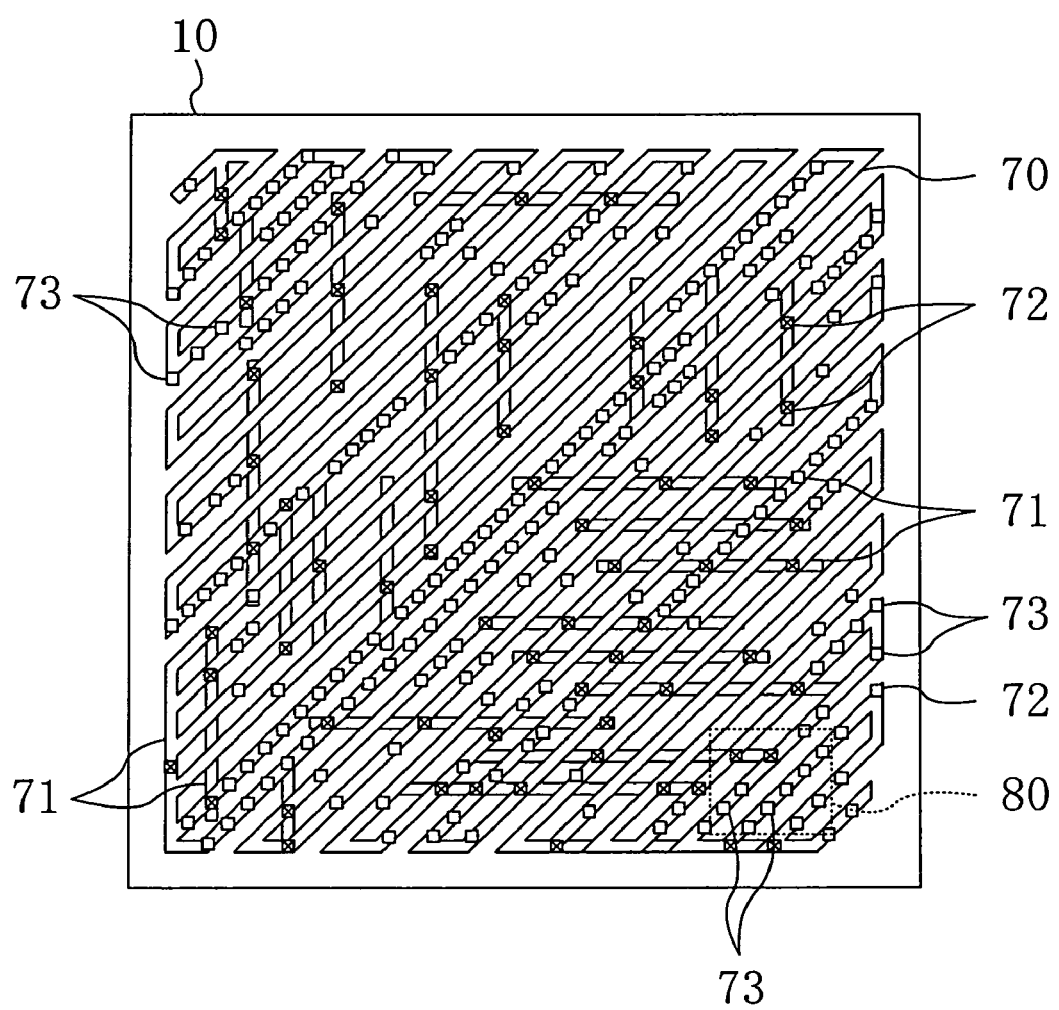
FIG. 12 is a plan view showing shield lines and LSI interconnection lines of a semiconductor integrated circuit device according to a second modification of the fourth embodiment of the present invention.
Figure 13:
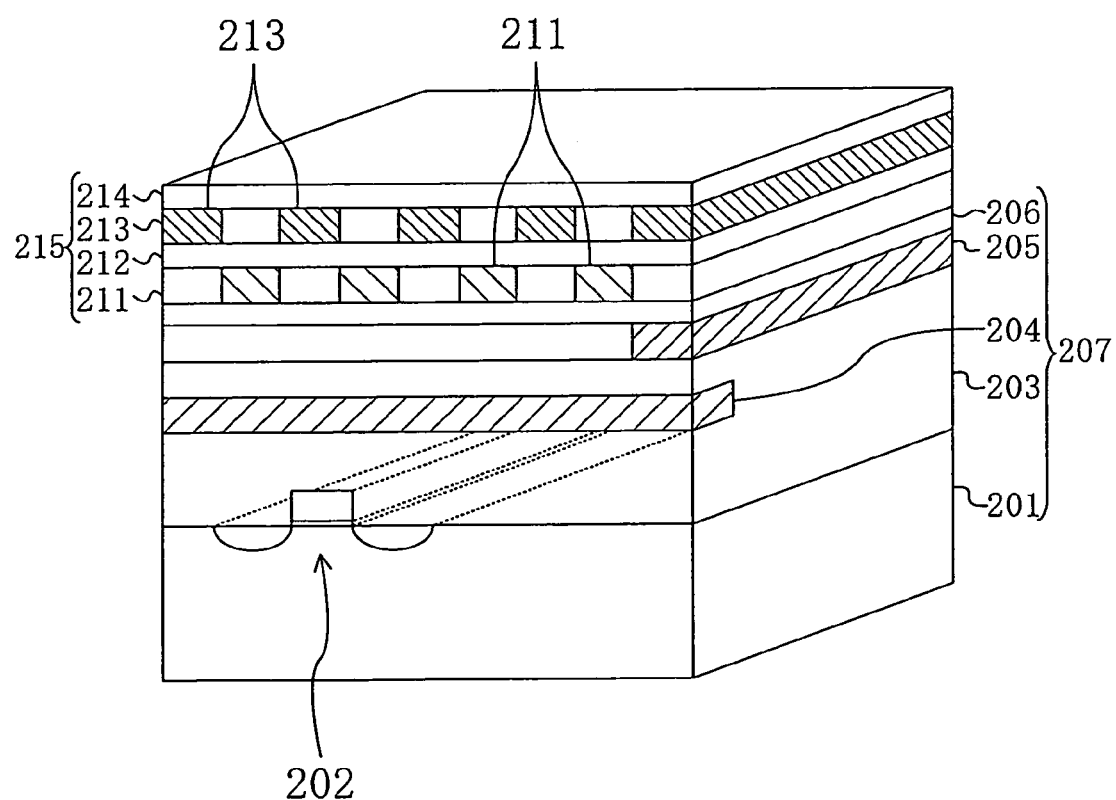
FIG. 13 is a perspective sectional view showing a conventional semiconductor integrated circuit device provided with shield lines.

FIG. 12 shows the plan configuration of shield lines and LSI interconnection lines included in a semiconductor integrated circuit device according to the second modification of the fourth embodiment of the present invention. Description of the components shown in FIG. 12 that are the same as those shown in FIG. 11 will be omitted by retaining the same reference numerals.

Referring to FIG. 12, a characteristic of the semiconductor integrated circuit device 10 according to the second modification is that the shield lines 70 are provided with multiple dummy vias 73 arranged randomly and not electrically connected to the signal lines (LSI interconnection lines) 71. Another characteristic of the device is that a well-known tampered processing detection circuit 80 is provided which detects a tampered processing of the shield lines 70.

In the case where, in order to make a physical alteration to an integrated circuit, an attempt is made to totally exfoliate the shield lines 70 with an agent and then to reconnect the disconnected portions of the lines, first, analysis of the portions required to be reconnected has to be carried out. On the chip 10 having the shield lines 70 exfoliated therefrom, the vias 72 as traces are left which have connected the shield lines 70 to a power source line, a ground line, or the signal lines 71 for controlling operation of the integrated circuit. By utilizing these traces as the key for the analysis, the portions required to be reconnected are easily analyzed by observing the layout of the chip.

However, in the second modification, the multiple dummy vias 73 not electrically connected to the signal lines 71 are arranged at random locations over the entire surface of the chip 10. Thereby, even though the layout of the circuit is observed, it is difficult to determine the normal vias 72 and to find out the key for this determination. This greatly increases the analysis time. In particular, it is preferably to arrange a greater number of dummy vias 73 around vias 72 connecting the shield lines 70 to the LSI interconnection line layer in which the tampered processing detection circuit 80 is formed.

As described above, in the second modification, the multiple dummy vias 73 having no electrical connections are randomly arranged over the entire surface of the chip 10. This makes it difficult for the layout observation to determine the portions required to be reconnected and even to find out the key for this determination. Consequently, the analysis time necessary for determination of the portions to be reconnected to the shield lines 70 significantly increases, which provides a greatly improved security to the device.

Note that also in the second modification, the shield lines 70 preferably have the configuration shown in the first embodiment.

What is claimed is:

1. A semiconductor integrated circuit device comprising:
   an integrated circuit; and
   a shield wiring layer formed above the integrated circuit and preventing a physical alteration to the integrated circuit,
   wherein the shield wiring layer includes a lower shield line and an upper shield line formed above the lower shield line,
   the directions in which the lower shield line and the upper shield line are arranged intersect each other,
   the lower shield line comprises a plurality of lower shield lines and the upper shield line comprises a plurality of upper shield lines, and
   the device further comprises a selector circuit which electrically connects at least two of the plurality of lower shield lines and/or the plurality of upper shield lines and which can change the line targeted for this connection.

2. The device of claim 1,
   wherein the selector circuit comprises a plurality of selector circuits, and
   the plurality of selector circuits are provided above the integrated circuit to have random intervals.

3. A semiconductor integrated circuit device comprising:
   an integrated circuit; and
   a shield wiring layer formed above the integrated circuit and preventing a physical alteration to the integrated circuit,
   wherein the shield wiring layer includes a lower shield line and an upper shield line formed above the lower shield line,
   the directions in which the lower shield line and the upper shield line are arranged intersect each other, and
   at least one of the lower shield line and the upper shield line has a connector connected to a power source line, a ground line, or a signal line for controlling the integrated circuit.

4. The device of claim 3,
wherein the connector comprises a plurality of connectors and the plurality of connectors are provided above at least one of the lower shield line and the upper shield line, and
the plurality of connectors are provided above the integrated circuit to have random intervals.

5. The device of claim 4,
wherein at least one of the lower shield line and the upper shield line is formed with a plurality of dummy vias randomly arranged without being electrically connected to the signal line.

6. A semiconductor integrated circuit device comprising:
an integrated circuit; and
a shield line formed above the integrated circuit and preventing a physical alteration to the integrated circuit,
wherein the directions in which the shield line and an interconnection line of the integrated circuit are arranged diagonally intersect each other.

7. The device of claim 6,
wherein the shield line comprises a plurality of shield lines, and
the device further comprises a selector circuit which electrically connects at least two of the plurality of shield lines and which can change the line targeted for this connection.

8. The device of claim 7,
wherein the selector circuit comprises a plurality of selector circuits, and
the plurality of selector circuits are provided above the integrated circuit to have random intervals.

9. The device of claim 6, wherein the shield line has a connector connected to a power source line, a ground line, or a signal line for controlling the integrated circuit.

10. The device of claim 9,
wherein the connector comprises a plurality of connectors and the plurality of connectors are provided above the shield line, and
the plurality of connectors are provided above the integrated circuit to have random intervals.

11. The device of claim 10, wherein the shield line is formed with a plurality of dummy vias randomly arranged without being electrically connected to the signal line.

* * * * *